US007829920B2

(12) United States Patent
Cho et al.

(10) Patent No.: US 7,829,920 B2
(45) Date of Patent: Nov. 9, 2010

(54) PHOTO DETECTOR AND A DISPLAY PANEL HAVING THE SAME

(75) Inventors: An-Thung Cho, Hsin-Chu (TW);
Chia-Tien Peng, Hsin-Chu (TW);
Kun-Chih Lin, Hsin-Chu (TW);
Wen-Jen Chiang, Hsinchu (TW);
Chih-Yang Chen, Hsinchu (TW);
Chrong-Jung Lin, Hsinchu (TW);
Ya-Chin King, Hsinchu (TW);
Chih-Wei Chao, Hsin-Chu (TW);
Chien-Sen Weng, Hsin-Chu (TW);
Feng-Yuan Gan, Hsin-Chu (TW)

(73) Assignee: Au Optronics Corporation, Hsin-Chu (TW)

( * ) Notice: Subject to any disclaimer, the term of this patent is extended or adjusted under 35 U.S.C. 154(b) by 294 days.

(21) Appl. No.: 12/175,585

(22) Filed: Jul. 18, 2008
(Under 37 CFR 1.47)

(65) Prior Publication Data
US 2009/0050906 A1  Feb. 26, 2009

(30) Foreign Application Priority Data
Jul. 18, 2007  (TW) .............................. 96126222 A

(51) Int. Cl.
*H01L 31/062* (2006.01)
(52) U.S. Cl. ................ 257/292; 257/458; 257/E31.061
(58) Field of Classification Search ................ 257/292, 257/458, E31.061
See application file for complete search history.

(56) References Cited

U.S. PATENT DOCUMENTS

| 5,061,978 | A | 10/1991 | Mizutani et al. |
| 6,243,069 | B1 | 6/2001 | Ogawa et al. |
| 6,489,631 | B2 | 12/2002 | Young et al. |
| 6,514,785 | B1 | 2/2003 | Chiang et al. |
| 7,453,424 | B2 | 11/2008 | Johnson et al. |
| 7,652,663 | B2 | 1/2010 | Sun |
| 2003/0132464 | A1* | 7/2003 | Yamaguchi et al. .......... 257/288 |
| 2006/0001098 | A1* | 1/2006 | Yang et al. .................. 257/355 |
| 2007/0138951 | A1 | 6/2007 | Park et al. |
| 2008/0185691 | A1* | 8/2008 | Cheng et al. ................ 257/656 |

FOREIGN PATENT DOCUMENTS

| JP | 62-202556 | 9/1987 |
| TW | M251147 | 11/2004 |
| TW | I261140 | 9/2006 |

OTHER PUBLICATIONS

English language translation of abstract of JP 62-202556.
English language translation of abstract of TW I261140.
English language translation of abstract of TW M251147.

* cited by examiner

*Primary Examiner*—Tu-Tu V Ho
(74) *Attorney, Agent, or Firm*—Thomas, Kayden, Horstemeyer & Risley, LLP

(57) ABSTRACT

A photo detector has a sensing TFT (thin film transistor) and a photodiode. The sensing TFT has a gate and a base. The photodiode has an intrinsic semiconductor region electrically connected to the gate and the base of the sensing TFT. The sensing TFT and the photodiode both have a structure comprising low temperature poly-silicon. A display panel contains the photo detector is also disclosed.

14 Claims, 6 Drawing Sheets

PHOTO DETECTOR AND A DISPLAY PANEL HAVING THE SAME

RELATED APPLICATIONS

This application claims priority to Taiwan Application Serial Number 96126222, filed Jul. 18, 2007, which is herein incorporated by reference.

BACKGROUND

1. Field of Invention

The present invention relates to a photo detector. More particularly, the present invention relates to a photo detector having a low temperature poly-silicon (LTPS) material for a display panel.

2. Description of Related Art

FIG. 1 is a schematic diagram illustrating a traditional PIN photo diode 100. A PIN photo diode 100 comprises an N-type semiconductor region 102, a P-type semiconductor region 104 and an intrinsic semiconductor region 106 between the N-type semiconductor region 102 and the P-type semiconductor region 104. When light irradiates the intrinsic semiconductor region 106, the holes ($h^+$) and electrons ($e^-$) generated by the photoelectric effect would respectively move to the P-type semiconductor region 104 and the N-type semiconductor region 102, thus generating a photoelectric current. It is well known that by measuring such photoelectric current, the PIN photo diode 100 could be used as a photo detector.

Generally, photo detectors manufactured by the LTPS thin film transistor (TFT) technique have the disadvantage of low photosensitivity. The low photosensitivity is because the thickness of the substrate used for photo-absorption is only about 50 nm. In addition, the traditional PIN photo diode suffers from the problem of excessive dark current due to its manufacturing process. Moreover, in consideration of the manufacturing process, a CMOS process that could carry out the implantation of the n+ ion and p+ ion at the same time would increase the complexity of the manufacturing process of the PIN photo diode. Therefore, the known solutions for increasing or improving the performance of photo detectors could not be completely adapted to or compatible with the current TFT manufacturing process of the display device.

SUMMARY

According to one embodiment of the present invention, a photo detector is provided. The photo detector comprises a sensing TFT and a photo diode. The sensing TFT has a gate and a base. The photo diode has an intrinsic semiconductor region electrically connected to the gate and the base of the sensing TFT. The sensing TFT and photo diode both have a structure comprising LTPS.

According to another embodiment of the present invention, a display panel is provided. The display panel comprises a pair of substrates correspondingly disposed, a liquid crystal layer and a plurality of pixel units. The liquid crystal layer is disposed between the pair of substrates, and the pixel units are disposed on the pair of substrates. Each pixel unit comprises a photo sensing region and a display region. The photo sensing region comprises a photo detector and a read-out TFT. The photo detector comprises a sensing TFT and a photo diode. The sensing TFT has a gate and a base, and the photo diode has an intrinsic semiconductor region electrically connected to the gate and the base of the sensing TFT. The read-out TFT reads the signal generated by the photo detector.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
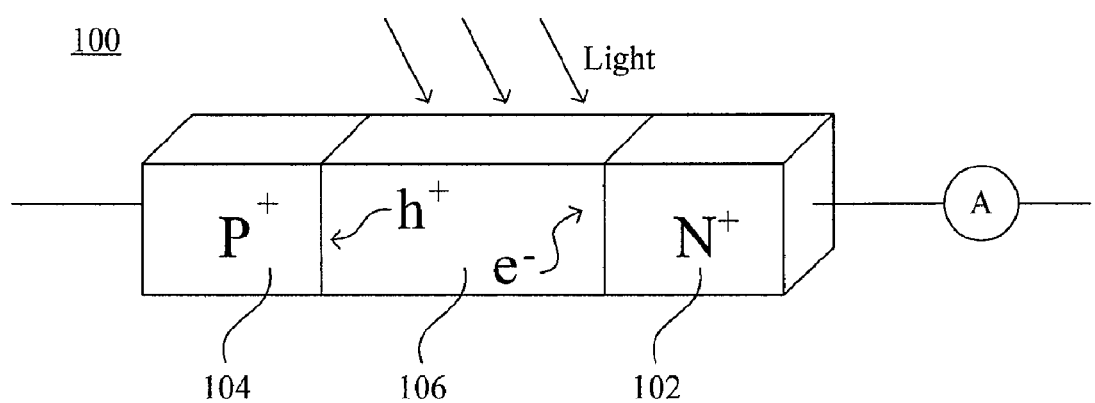
FIG. 1 is a schematic diagram illustrating the traditional PIN photo diode.
Figure 2A:
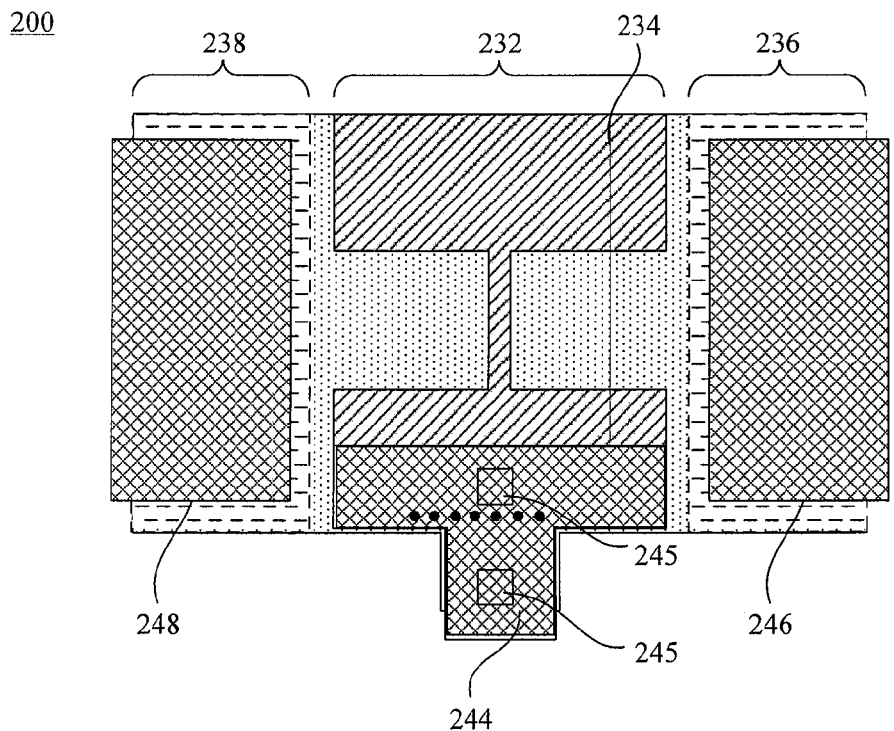
FIG. 2A is a top view diagram illustrating a photo detector according to one embodiment of the present invention.
Figure 2B:
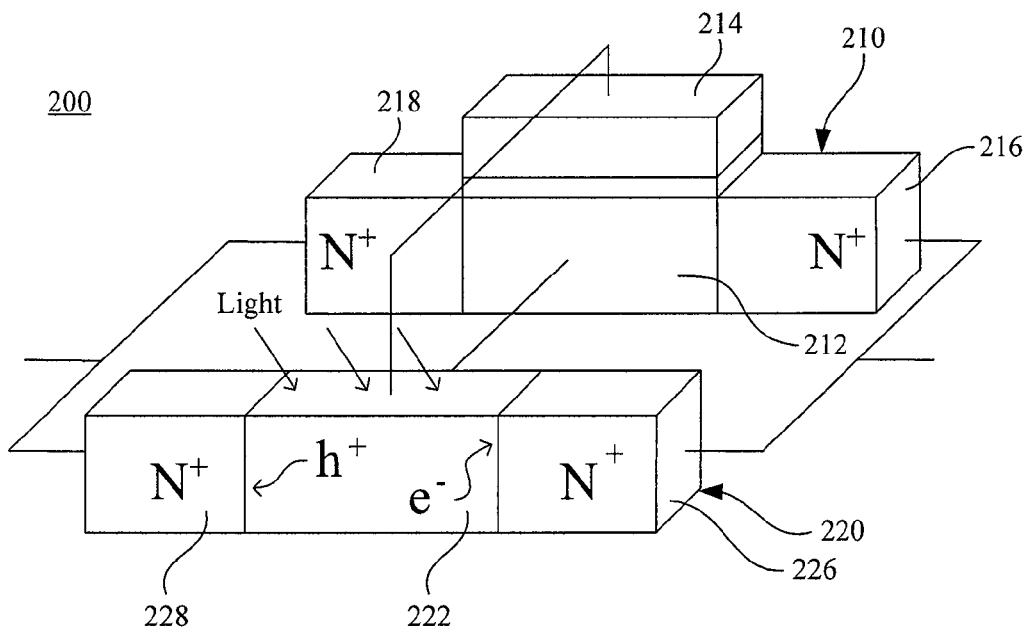
FIG. 2B is a schematic diagram illustrating the corresponding structure of the photo detector of FIG. 2A.

FIG. 2A is a top view diagram illustrating a photo detector according to one embodiment of the present invention. FIG. 2B is a schematic diagram illustrating the corresponding structure of the photo detector of FIG. 2A. Refer to both FIG. 2A and FIG. 2B. The photo detector 200 comprises a sensing TFT 210 and a photo diode 220. The sensing TFT 210 has a base 212, a gate 214, a drain 216, and a source 218. The photo diode 220 has an intrinsic semiconductor region 222 and two N-type semiconductor regions 226 and 228. The intrinsic semiconductor region 222 electrically connects to the base 212 and the gate 214, and the drain 216 and the source 218 electrically connect to the N-type semiconductor regions 226 and 228 respectively. The sensing TFT 210 and the photo diode 220 both have an LTPS structure.

More specifically, the substrate of the photo detector 200 of FIG. 2A is an LTPS material, and the photo detector 200 could be divided into three regions: an intrinsic semiconductor region 232, and N-type semiconductor regions 236 and 238 that are disposed on both sides of the intrinsic semiconductor region 232. The intrinsic semiconductor region 232 corresponds to the base 212 and intrinsic semiconductor region 222 of FIG. 2B. An H-shaped metal layer 234 is disposed on the intrinsic semiconductor region 232 and corresponds to the gate 214 of FIG. 2B. The intrinsic semiconductor region 232 that is not shielded by the H-shaped metal layer 234 corresponds to the intrinsic semiconductor region 222 of the photo diode 220 which is used to receive light. The N-type semiconductor region 236 corresponds to the drain 216 and the N-type semiconductor region 226 in FIG. 2B. The N-type semiconductor region 238 corresponds to the source 218 and the N-type semiconductor region 228 in FIG. 2B.

When the intrinsic semiconductor region 232 is irradiated by light the electron/hole pairs resulted from the photoelectric effect move toward the two opposite ends of the photo diode 220 and turn on the sensing TFT 210 thereby generating a positive feedback in order to amplify the photoelectric current of the photo detector 200. In this way, the photosensitivity of the photo detector 200 is significantly improved. In this embodiment, the sensing TFT 210 could be an N-type metaloxide-semiconductor (NMOS) TFT, and the photo diode 220 could be an N-type-intrinsic-N-type (NIN) semiconductor diode. However, according to other embodiments, a P-type metal-oxide-semiconductor (PMOS) TFT can be used as a sensing TFT, and P-type-intrinsic-P-type (PIP) semiconductor diode can be used as a photo diode. Hence, the architecture of the photo detector of this embodiment could be implanted by the PMOS-LTPS technique, which is more cost-effective in the display panel manufacturing process.

Moreover, the aforementioned sensing TFT and photo diode could be used in a display panel. For example, the intrinsic semiconductor region 232 (i.e., the base 212 and the intrinsic semiconductor region 222) could be disposed in the LTPS layer of the display panel, and the H-shaped metal layer 234 (i.e., the gate 214) could be disposed in the first metal layer of the display panel. In addition, the H-shaped metal layer 234 (i.e., the gate 214) could electrically connect to the intrinsic semiconductor region 232 (i.e., the intrinsic semiconductor region 222 of the photo diode 220) by means of at least one contact plug 245 of the second metal layer (such as the metal layer 244) of the display panel. In addition, the second metal layer (such as the metal layers 246, 248) of the display panel could also be used as a contact electrode of the N-type semiconductor regions 236 and 238.

Figure 3A:
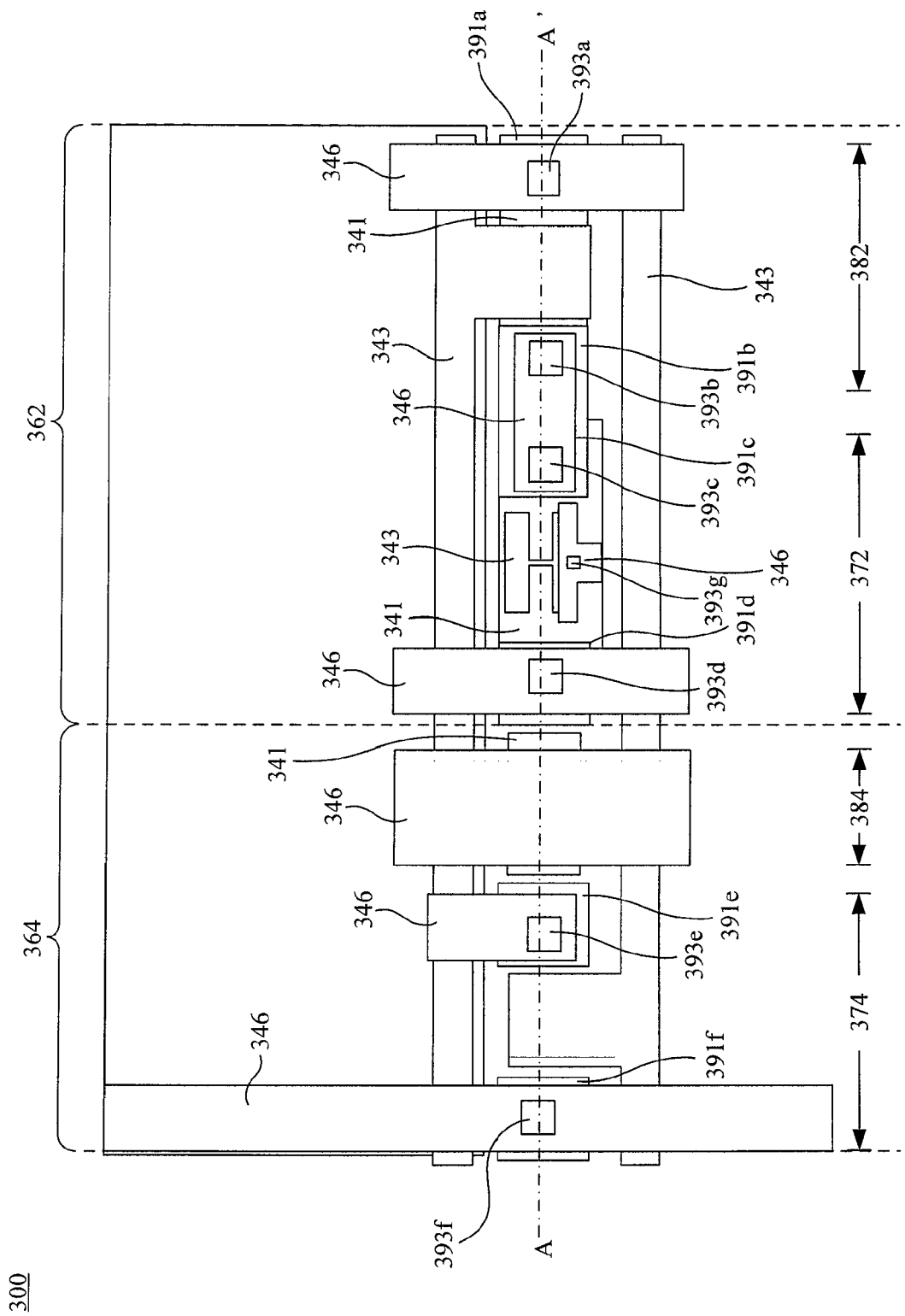
FIG. 3A is a top view diagram illustrating a display panel according to one embodiment of the present invention.
Figure 3B:
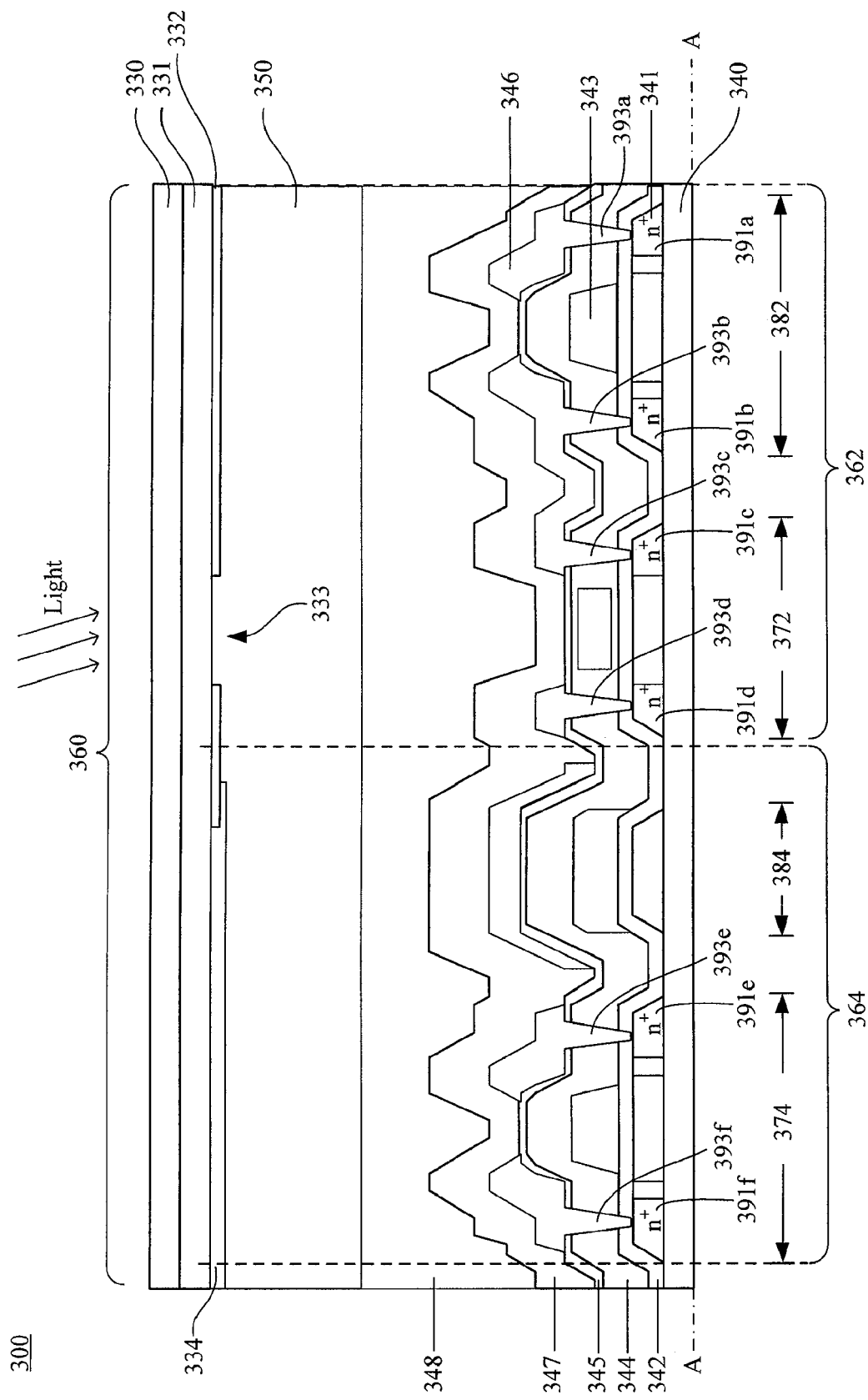
FIG. 3B is a cross-sectional view of the Line AA' of FIG. 3A.
Figure 3C:
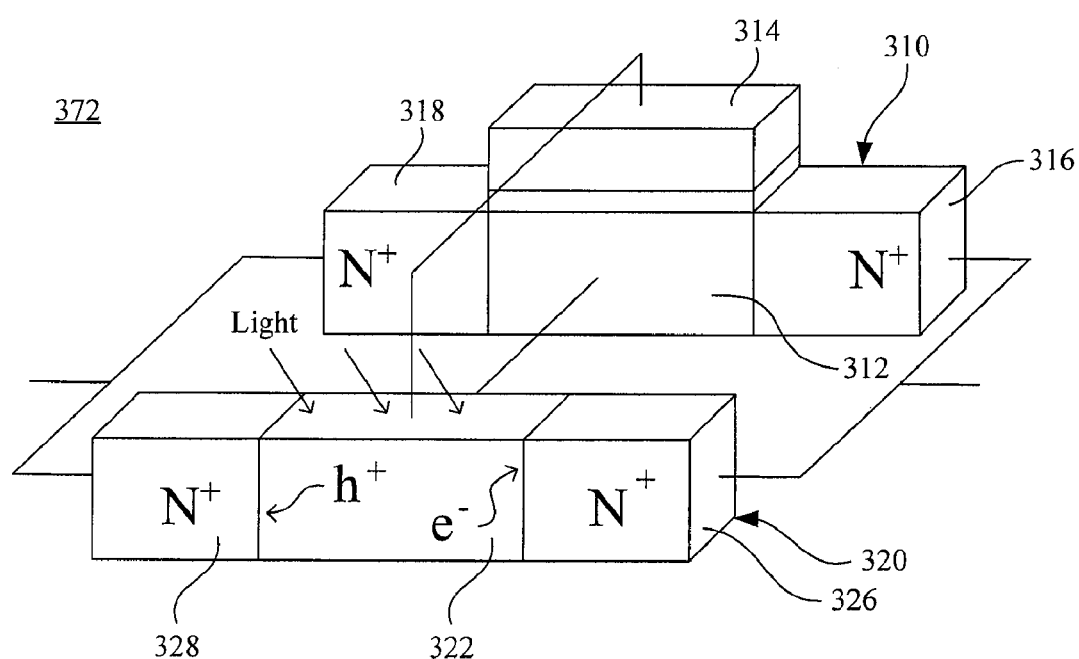
FIG. 3C is a schematic diagram illustrating the corresponding structure of the photo detector of FIG. 3A.

FIG. 3A is a top view diagram illustrating a display panel according to one embodiment of the present invention. FIG. 3B is a cross-sectional view taken along the line AA' of FIG. 3A. FIG. 3C is a schematic diagram illustrating the corresponding structure of the photo detector of FIG. 3A. Refer to FIG. 3A, FIG. 3B and FIG. 3C. The display panel 300 comprises a pair of correspondingly disposed substrates 330 and 340, a liquid crystal layer 350 and a plurality of pixel units 360. For the purpose of simplicity and clarity, only one pixel unit 360 is shown in FIG. 3A and FIG. 3B. The liquid crystal layer 350 is disposed between the pair of substrates 330 and 340, and the pixel unit is disposed on the pair of substrates 330 and 340. Each pixel unit 360 comprises a photo sensing region 362 and a display region 364. The photo sensing region 362 comprises a photo detector 372 and a read-out TFT 382. The read-out TFT 382 reads the signal generated by the photo detector 372. As shown in FIG. 3C, the corresponding structure of the photo detector 372 comprises a sensing TFT 310 and a photo diode 320. The sensing TFT 310 has a gate 314 and a base 312, and the photo diode 320 has an intrinsic semiconductor region 322 electrically connected to the gate 314 and the base 312 of the sensing TFT 310.

The material of at least one of the substrates 330 and 340 is transparent material (such as glass, quartz, or the like), non-transparent material (such as Silica sheet, ceramics, or the like), flexible material (such as polyester, polyalkene, polyamide, polyol, poly cycloalkane, poly aromatics, or the like or combinations thereof), or combinations thereof. According to one example of this embodiment, the substrates 330 and 340 are glass substrates.

A common electrode 331 is disposed on the substrate 330. A material of the common electrode 331 could be a transparent conductive material, such as indium tin oxide, aluminum zinc oxide, cadmium tin oxide, indium zinc oxide, aluminum tin oxide, or the like or combinations thereof. A light shielding layer 332 (such as black matrix) and a color filter layer 334 are disposed on the common electrode 331 and correspond respectively to the photo sensing region 362 and the display region 364. A semiconductor layer 341, an insulating layer 342, a first metal layer 343, an insulating layer 344, an insulating layer 345, a second metal layer 346, a protective layer 347, and an insulating layer 348 are sequentially formed on the substrate 340 and patterned respectively so as to form a photo detector 372, a read-out TFT 382, a display TFT 374, a storage capacitor 384, N-type semiconductor regions 391*a*-391*f*, and contact plugs 393*a*-393*g*.

The material of the semiconductor layer 341 could be, for example, polycrystalline silicon, micro-crystalline silicon, single-crystalline silicon, amorphous silicon, or combinations thereof. In this embodiment, the material of the semiconductor layer 341 is an LTPS. The material of at least one of the insulating layer 342, the insulating layer 344, the insulating layer 345, the protective layer 347, and the insulating layer 348 is organic material (such as a photoresist material, polyarylene ether (PAE), polyamide, polyester, polyol, polyalkene, benzocyciclobutene (BCB), hydrogen silsesquioxane (HSQ), methyl silesquioxane (MSQ), silicone hydrocarbon (SiOC—H), or the like or combinations thereof), inorganic material (such as silicon oxide, silicon nitride, silicon nitrogen oxide, silicon carbide, hafnium oxide, or the like or combinations thereof), or combinations thereof.

More specifically, the semiconductor layer 341 of FIG. 3A and FIG. 3B correspond to the base 312 and the intrinsic semiconductor region 322 of FIG. 3C. The first metal layer 343 of FIG. 3A and FIG. 3B corresponds to the gate 314 of FIG. 3C and electrically connects to the semiconductor layer 341 by means of such as at least one contact plug 393*a*-393*g* of the second metal layer 346. The semiconductor layer 341 of the photo detector 372 of FIG. 3A and FIG. 3B, which is not shielded by the first metal layer 343, corresponds to the intrinsic semiconductor region 322 of the photo diode 320 of FIG. 3C for receiving light. The N-type semiconductor region 391*c* of FIG. 3A and FIG. 3B corresponds to the drain 316 and the N-type semiconductor region 326 of FIG. 3C, while the N-type semiconductor region 391*d* of FIGS. 3A and 3B corresponds to the source 318 and the N-type semiconductor region 328 of FIG. 3C.

In this embodiment, the sensing TFT 310 is an NMOS TFT, and the photo diode 320 is an NIN diode. However, in other embodiments, it is possible to use a PMOS TFT as the sensing TFT, and a PIP diode as the photo diode. Moreover, the aforementioned pixel unit 360 comprises at least one sub-pixel unit, wherein it is defined that each sub-pixel unit corresponds to a single display region. In other words, when there is more than one color within a single pixel unit, it is possible to selectively dispose one photo sensing region at each display region with a different color. Alternatively, a plurality of display regions within a pixel unit could share a photo sensing region.

The actuating relationship of the pixel unit 360 in response to changing light is discussed. As shown in FIG. 3B, the light shielding layer 332 has an opening 333 corresponding to the photo detector 372 (such as the intrinsic semiconductor region 322 within the photo diode 320 which is used for receiving the light). The opening 333 detects the external changing light of the pixel unit 360. The photoelectric current generated by the photo diode 320 as a result of light irradiation could pass through and turn on the sensing TFT 310 and thereby amplify the photoelectric current of the photo detector 372. Afterward, the photoelectric current is read by the read-out TFT 382 so as to be transferred to the external circuit (such as processor).

For example, when the light is not shielded from the exterior of the pixel unit 360 (i.e., when the opening 333 is not blocked by an obstacle such as a finger or a foreign matter), the light intensity received by the intrinsic semiconductor region 322 is increased and thereby amplifies the photoelectric current signal that the sensing TFT 310 received. In this case, the read-out TFT 382 would transfer a signal representing non-obstacle to the external processor. When an obstacle approaches the pixel unit 360 and thus blocks the light, the light intensity received by the intrinsic semiconductor region 322 is decrease and thereby reduces the photoelectric current signal that the sensing TFT 310 received. In this case, the read-out TFT 382 would transfer a signal representing an obstacle to the external processor.

If the display panel 300 is a touch display panel, the processor would determine the position of the pixel unit within the display panel 300 which the finger or the foreign matter is pressed against based on such signal. Alternatively, if the display panel utilizes such a pixel unit 360 or the photo sensing region 362 to detect the light quantity of the external environment, the processor would determine whether the light quantity of the external environment where the display panel 300 is situated in is sufficient based on such signal. Furthermore, the processor could adjust the light intensity of the back light module based on such signal.

Figure 4:
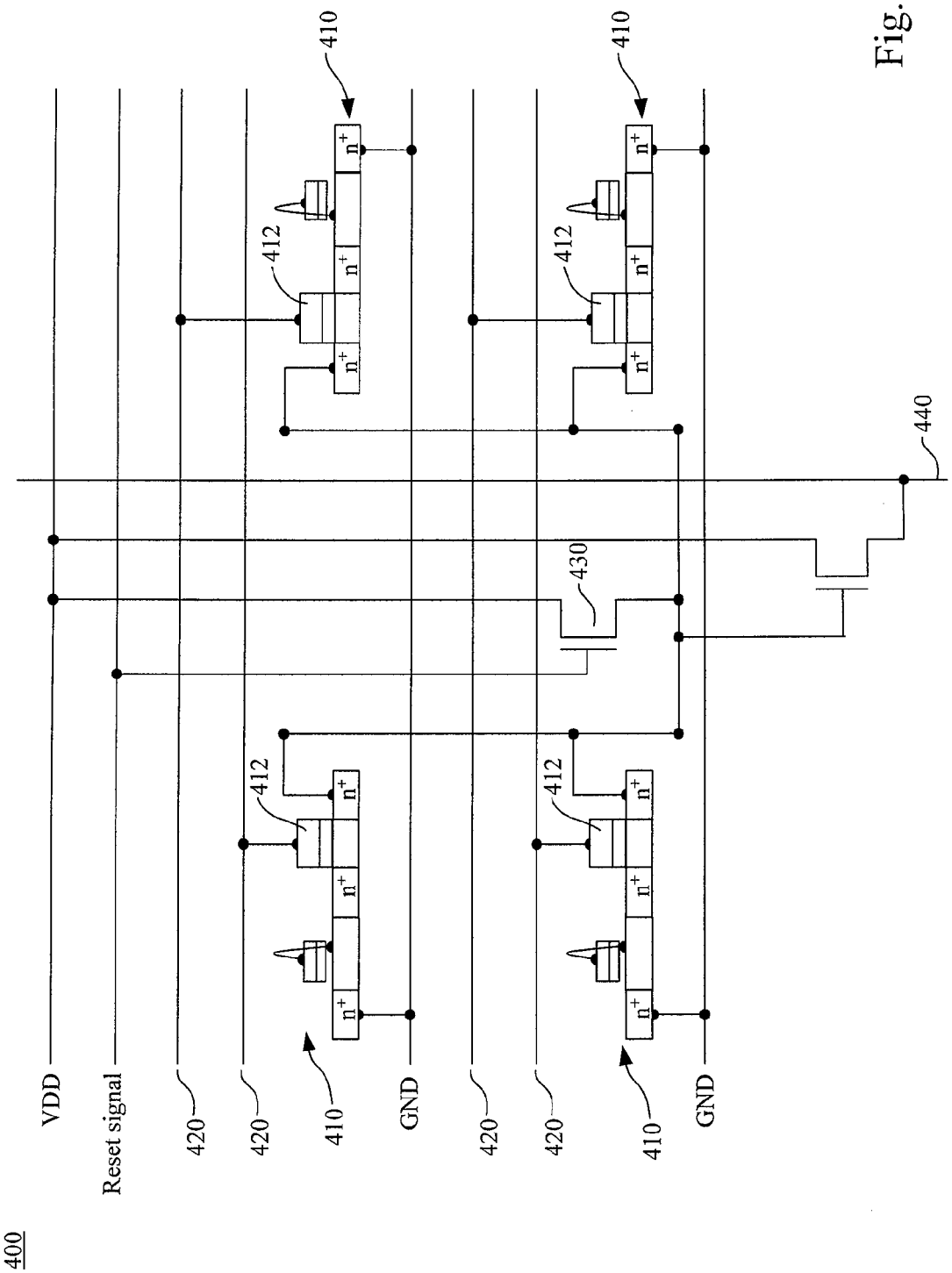
FIG. 4 is schematic diagram illustrating an active pixel sensor architecture according to one embodiment of the present invention.

The aforementioned photo sensing region 362 could adapt an active pixel sensor (APS) architecture, a passive pixel sensor (PPS) architecture, or other suitable sensor architecture to accomplish the connection relation between the photo detector 372 and the read-out TFT 382. FIG. 4 is schematic diagram illustrating an active pixel sensor architecture 400 according to one embodiment of the present invention. Signal lines 420 of different rows control a plurality of pixel units 410. The read-out TFTs 412 transfer signals to the processor through the reset transistor 430 by means of a common line 440.

Although the present invention has been described in considerable detail with reference to certain embodiments thereof, other embodiments are possible. It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A photo detector, comprising:
a sensing thin film transistor having a gate and a base; and
a photo diode having an intrinsic semiconductor region electrically connected to the gate and the base, wherein the sensing thin film transistor and the photo diode both have a structure comprising low temperature poly-silicon, wherein the sensing thin film transistor and the photo diode are formed within a display panel, wherein the base and the intrinsic semiconductor region are disposed within a low temperature poly-silicon layer of the display panel, and the gate is disposed within a first metal layer of the display panel and electrically connected to the intrinsic semiconductor region by means of at least one contact plug of a second metal layer.

2. The photo detector of claim 1, wherein the gate is H-shaped and disposed on the intrinsic semiconductor region.

3. The photo detector of claim 1, wherein the sensing thin film transistor further comprises a drain and a source electrically connected to two opposite ends of the photo diode respectively.

4. The photo detector of claim 1, wherein the photo diode is a PIP diode when the sensing thin film transistor is a PMOS thin film transistor, and the photo diode is an NIN diode when the sensing thin film transistor is an NMOS thin film transistor.

5. A display panel, comprising:
a pair of substrates correspondingly disposed;
a liquid crystal layer disposed between the pair of substrates; and
a plurality of pixel units disposed on the pair of substrates, each of the pixel units comprising a photo sensing region and a display region, wherein the photo sensing region comprises:
a photo detector, comprising:
a sensing thin film transistor having a gate and a base; and
a photo diode having an intrinsic semiconductor region electrically connected to the gate and the base; and
a read-out thin film transistor for reading the signal generated by the photo detector.

6. The display panel of claim 5, wherein the sensing thin film transistor and the photo diode both have a structure comprising low temperature poly-silicon.

7. The display panel of claim 5, wherein the pixel unit comprises at least one sub-pixel unit.

8. The display panel of claim 5, wherein the display region comprises a storage capacitor and a display thin film transistor.

9. The display panel of claim 5, wherein the base and the intrinsic semiconductor region is disposed within a low temperature poly-silicon layer, and the gate is disposed within a first metal layer and electrically connected to the intrinsic semiconductor region by means of a second metal layer, wherein the low temperature poly-silicon layer, the first metal layer and the second metal layer are formed sequentially on one of the pair of substrates.

10. The display panel of claim 5, wherein the gate is H-shaped and disposed on the intrinsic semiconductor region.

11. The display panel of claim 5, wherein the sensing thin film transistor further comprises a drain and a source electrically connected to two opposite ends of the photo diode respectively.

12. The display panel of claim 5, wherein the photo diode is a PIP diode when the sensing thin film transistor is a PMOS thin film transistor, and the photo diode is a NIN diode when the sensing thin film transistor is a NMOS thin film transistor.

13. The display panel of claim 5, wherein one of the pair of substrates has a light shielding layer having an opening corresponding to the photo diode.

14. The display panel of claim 5, wherein the display panel is a touch display panel.

* * * * *